(12) United States Patent
Chen et al.

(10) Patent No.: US 10,874,030 B2
(45) Date of Patent: Dec. 22, 2020

(54) FLEXIBLE COLD PLATE WITH FLUID DISTRIBUTION MECHANISM

(71) Applicant: QUANTA COMPUTER INC., Taoyuan (TW)

(72) Inventors: Chao-Jung Chen, Taoyuan (TW); Yu-Nien Huang, Taoyuan (TW); Ching-Yu Chen, Taoyuan (TW); Kuo-Wei Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 30 days.

(21) Appl. No.: 16/393,380

(22) Filed: Apr. 24, 2019

(65) Prior Publication Data

US 2020/0214172 A1 Jul. 2, 2020

Related U.S. Application Data

(60) Provisional application No. 62/785,096, filed on Dec. 26, 2018.

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 7/20* | (2006.01) | |

(52) U.S. Cl.
CPC ..... *H05K 7/20272* (2013.01); *H05K 7/20772* (2013.01)

(58) Field of Classification Search
CPC ............ G06F 1/20; G06F 1/203; G06F 1/206; H05K 7/20272; H05K 7/20772
See application file for complete search history.

(56) References Cited

U.S. PATENT DOCUMENTS

| | | | | |
|---|---|---|---|---|
| 8,363,402 B2* | 1/2013 | Brunschwiler | ....... | H01L 23/473 |
| | | | | 361/699 |
| 9,844,165 B2* | 12/2017 | Sever | ...................... | F28F 13/12 |
| 10,504,814 B2* | 12/2019 | Schultz | ............... | H01L 23/3677 |
| 2011/0272120 A1* | 11/2011 | Joshi | ................... | F28D 1/05366 |
| | | | | 165/104.13 |

(Continued)

FOREIGN PATENT DOCUMENTS

| | | |
|---|---|---|
| DE | 102017114044 A1 | 1/2018 |
| EP | 1726197 A2 | 11/2006 |

(Continued)

OTHER PUBLICATIONS

Extended European Search Report for EP Application No. 19203227.4, dated Mar. 25, 2020.

*Primary Examiner* — Anthony M Haughton
(74) *Attorney, Agent, or Firm* — Nixon Peabody LLP

(57) ABSTRACT

A cold plate base is provided. The cold plate includes a fluid intake region located at a distal end of the cold plate, and a fluid outtake region located at a proximal end of the cold plate that is opposite the distal end. The cold plate also includes a fin region positioned between the fluid intake region and the fluid outtake region. The fin region extends from a base surface of the cold plate base. The cold plate also includes a plurality of protrusions at the fluid intake region. Each of the plurality of protrusions radiates from the fluid intake region to create flow paths across the fin region.

20 Claims, 5 Drawing Sheets

(56) References Cited

U.S. PATENT DOCUMENTS

| | | | |
|---|---|---|---|
| 2013/0112388 A1* | 5/2013 | Kwak | H01L 23/473 |
| | | | 165/185 |
| 2015/0173251 A1* | 6/2015 | Campbell | H05K 7/20772 |
| | | | 361/699 |
| 2016/0290728 A1 | 10/2016 | Coteus et al. | |
| 2016/0338222 A1 | 11/2016 | Reeves et al. | |
| 2017/0231115 A1 | 8/2017 | Kobayashi et al. | |
| 2018/0115031 A1 | 4/2018 | Lee | |

FOREIGN PATENT DOCUMENTS

| | | |
|---|---|---|
| WO | 2015177909 A1 | 11/2015 |
| WO | 2018011152 A1 | 1/2018 |

\* cited by examiner

FLEXIBLE COLD PLATE WITH FLUID DISTRIBUTION MECHANISM

CROSS REFERENCE TO RELATED APPLICATIONS

This application claims priority under 35 U.S.C. § 119 to U.S. Provisional Application No. 62/785,096, entitled "Flexible Cold Plate with Fluid Distributor Mechanism," and filed on Dec. 26, 2018. The contents of that application are hereby incorporated by reference in their entirety.

FIELD OF THE INVENTION

The present disclosure generally relates to cooling a heat-producing device. Specifically, the present disclosure relates to an apparatus for cooling server applications using improved liquid-based cooling systems.

BACKGROUND

The rapid increase in data storage and high bandwidth communication driven by Internet expansion is increasing the need for dense interconnection systems in data centers. These data centers are typically composed of rows of racks of servers. These servers need to be in high-bandwidth communication with other servers in the data centers. The high-bandwidth communication can be supported by either shielded electrical cables or increasingly active optical cables. Active optical cables support longer transmission distances and higher transmission bandwidths. An active optical cable typically has an optical engine incorporated into a transceiver on at least one end of the cable. The optical engine transforms electrical signals into optical signals (transmission [Tx] function), and transforms optical signals into electrical signals (receiver [Rx] function). An electronics rack can have hundreds or even thousands of interconnections, each of which generating heat that must be removed from the electronics rack. The inability to remove this heat can result in accelerated aging and/or premature failure of the interconnection of other components in the electronics rack. Therefore, there is a need to provide a cooling system in high speed communication devices that facilitates high-heat removal and dense packaging of the interconnections.

SUMMARY

A cold plate base is provided herein. The cold plate includes a fluid intake region located at a distal end of the cold plate, and a fluid outtake region located at a proximal end of the cold plate that is opposite the distal end. The cold plate also includes a fin region positioned between the fluid intake region and the fluid outtake region. The fin region extends from a base surface of the cold plate base. The cold plate also includes protrusions at the fluid intake region. Each of the protrusions are positioned to radiate outward from the fluid intake region and create flow paths across the fin region.

In some embodiments, each of the protrusions can be symmetrical about a central axis. The fin region can include wall regions where each wall region is separated by a fin region gap. In some embodiments, the flow paths are evenly spaced about the wall regions.

In some embodiments, the base surface of the cold plate base just beneath the fin region has a thickness of up to 2 millimeters. Alternatively, the base surface of the cold plate base just beneath the fin region can be made-up of a thermal conductive flexible material.

A cooling apparatus is also provided herein. The cooling apparatus includes a radiator and a cold plate connected to the radiator by at least two fluid tubes. The cold plate can include a cold plate base. As indicated above, the cold plate base can include a fluid intake region located at a distal end of the cold plate, and a fluid outtake region located at a proximal end of the cold plate that is, opposite the distal end. The cold plate also includes a fin region positioned between the fluid intake region and the fluid outtake region. The fin region extends from a base surface of the cold plate base. The cold plate also includes protrusions at the fluid intake region. Each of the protrusions are positioned to radiate from the fluid intake region and create flow paths across the fin region.

In some embodiments, the cold plate also includes a cold plate cover configured to cover the cold plate base. The cold plate cover includes a fluid intake aperture aligned with the fluid intake region and a fluid outtake aperture aligned with the fluid outtake region. The cold plate can be coupled to an electrical component.

A server device is also provided herein. The server device includes the electronic component and the cooling apparatus as described above.

Additional features and advantages of the disclosure will be set forth in the description that follows, and in part, will be obvious from the description; or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited disclosure and its advantages and features can be obtained, a more particular description of the principles described above will be rendered by reference to specific examples illustrated in the appended drawings. These drawings depict only example aspects of the disclosure, and are therefore not to be considered as limiting of its scope. These principles are described and explained with additional specificity and detail through the use of the following drawings.

DETAILED DESCRIPTION

Figure 1A:
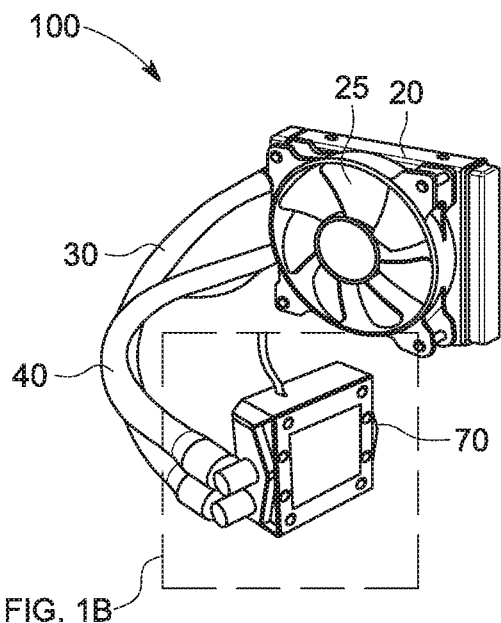
FIG. 1A illustrates a traditional cooling apparatus, as generally known in the prior art.

The present invention is described with reference to the attached figures, where like reference numerals are used throughout the figures to designate similar or equivalent elements. The figures are not drawn to scale, and they are provided merely to illustrate the instant invention. Several aspects of the embodiments disclosed herein are described below with reference to example applications for illustration. It should be understood that numerous specific details, relationships, and methods are set forth to provide a full understanding of the embodiments herein. One having ordinary skill in the relevant art, however, will readily recognize that the embodiments disclosed herein can be practiced without one or more of the specific details, or with other methods. In other instances, well-known structures or operations are not shown in detail to avoid obscuring the embodiments disclosed herein. The present embodiments disclosed herein are not limited by the illustrated ordering of acts or events, as some acts may occur in different orders and/or concurrently with other acts or events. Furthermore, not all illustrated acts or events are required to implement a methodology in accordance with the present embodiments disclosed herein.

FIG. 1A illustrates a traditional cooling apparatus 100, as known in the prior art. The traditional cooling apparatus 100 can include a radiator 20 and a cooling plate 70. The radiator 20 can be connected to the cooling plate 70 by liquid tubes 30 and 40. As generally understood in the art, the traditional cooling apparatus 100 is a closed-loop cooling system that moves water between both the radiator 20 and the cooling plate 70. The cooling plate 70 is thermally connected to a heat generating device (not shown). For the purposes of this example, the heat generating device can be an electronic component within a server device. It is appreciated that closed-loop cooling systems are used in various applications.

As water passes through the cooling plate 70, it becomes warmer due to the thermal coupling of the heat generating device and the cooling plate 70. The warm water is pumped to the radiator 20 by way of the liquid tube 30. The radiator 20 houses a fan 25. The fan 25 is configured to remove heat from water passing through the radiator 20 by way of convection. The cooler water is pumped back to the cooling plate 70 by way of the liquid tube 40. The application of the cooling plate 70 provides a component specific solution to removing heat.

Figure 1C:
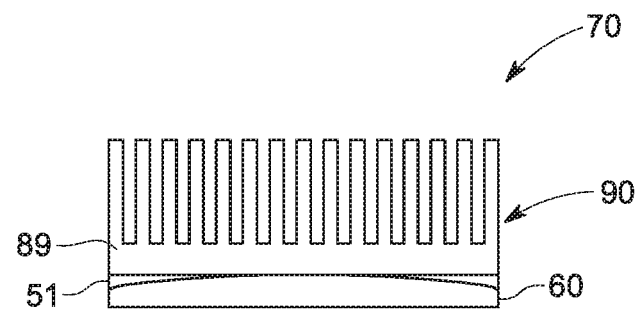
FIG. 1C illustrates a cross-sectional view of a cooling plate base of the cooling plate of FIG. 1B, as generally known in the prior art.
Figure 1B:
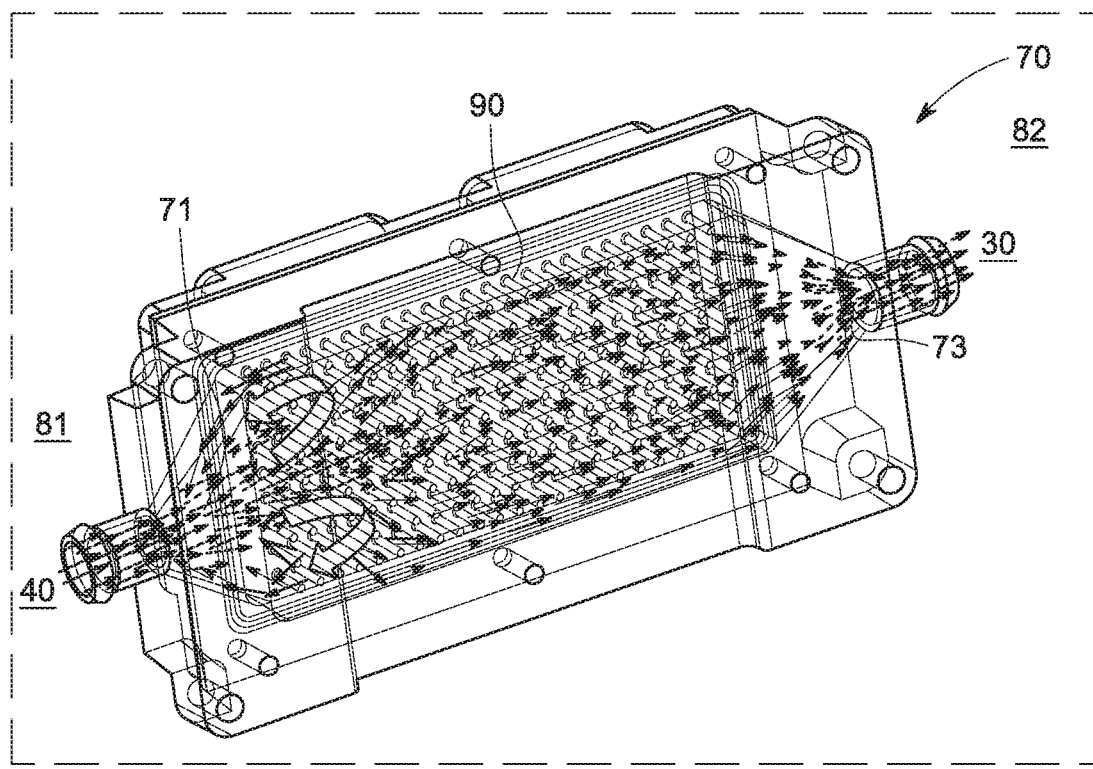
FIG. 1B illustrates a traditional cooling plate of the cooling apparatus of FIG. 1A, as generally known in the prior art.

FIG. 1B illustrates the inner workings of the cooling plate 70. The cooling plate 70 has a distal end 81 and an opposing proximal end 82. The orientation of the cooling plate 70 is provided for illustration purposes only. It is understood the cooling plate 70 can be oriented in various configurations, and the proximal and distal ends are relative to the beholder. As a result, the direction is not intended to be limiting. The cooling plate 70 includes a fluid intake region 71 at its distal end 81. The fluid intake region 71 is connected to the liquid tube 40 (of FIG. 1A). The cooling plate 70 also includes a fluid outtake region 73 at its proximal end 82. FIG. 1B illustrates fluid passing through the cooling plate 70. The fluid enters into the cooling plate 70 at a single point and passes through a fin region 90.

FIG. 1C illustrates a cross-sectional view of the cooling plate 70, as generally known in the prior art. FIG. 1C also illustrates the contact between the cooling plate 70 and a heat generating component 60. The fin region 90 extends from a base surface 89 of the cooling plate 70. The fin region 90 is typically uniform and provides more contact surface for the fluid to ultimately cool the heat generating component 60.

Referring back to FIG. 1B, the fluid intake region 71 is a single entry point, or aperture. As the fluid enters into the cooling plate 70 via the fluid intake region 71, the fluid flows primarily in a middle area of the fin region 90. Sides of the fin region 90 will receive less fluid than the middle area. The flow of the fluid primarily to the middle area produces a reverse vortex, as shown herein. The efficiency of the overall cooling plate decreases as a result.

Referring momentarily to FIG. 1C, the cooling plate 70 and the heat generating component 60 are generally in direct thermal contact. However, where the heat generating component 60 has a non-uniform shape, a gap forms between the heat generating component 60 and the cooling plate 70. Thermal grease 51 is implemented to cover the gap to increase the thermal conduction. Thicker grease is implemented where there are various surface indentions on the heat generating component. However, the thicker grease causes the thermal conduction to worsen, thereby negatively impacting the efficiency of the overall cooling plate.

The present embodiment provides a unique cooling plate design to be incorporated into the cooling apparatus of FIG. 1A. The cooling plate can include a flow distributor mechanism in front of the fluid intake region to direct and evenly distribute fluid flow across the fin region. The disclosed mechanism separates the average fluid volume to the fin region. The uniform fluid flow increases fin efficiency. The present embodiment also provides a flexible cold plate base to create a uniform thermal contact with the electronic component and improve the efficiency of the cold plate. The disclosed embodiments are discussed below with respect to FIGS. 2-6.

Figure 2:
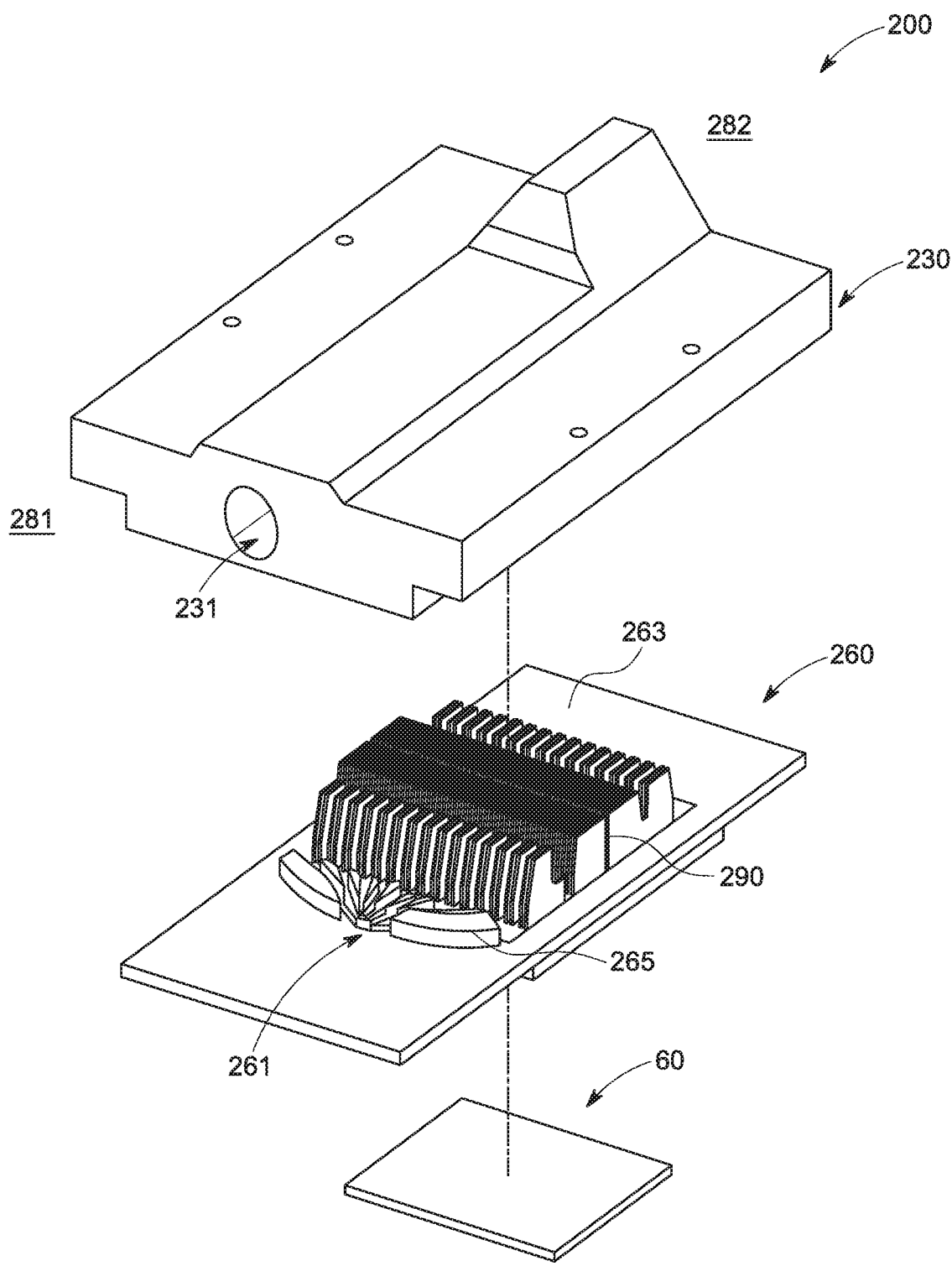
FIG. 2 illustrates an exploded view of an exemplary cooling plate, in accordance with an implementation of the disclosure.

FIG. 2 illustrates an exploded view of an exemplary cooling plate 200, in accordance with an implementation of the disclosure. The cooling plate 200 includes a cold plate cover 230 and a cold plate base 260. The cooling plate 200, once assembled, contacts the heat generating component 60. Specifically, a bottom surface of the cold plate base 260 comes into thermal contact with the heat generating component 60. The cooling plate 200 includes a distal end 281 and a proximal end 282.

The cold plate cover 230 includes a fluid intake aperture 231 at the distal end 281, and a fluid outtake aperture (not shown) at the proximal end 282. The cold plate base 260 can include a fluid intake region 261 adjacent with the fluid intake aperture 231 of the cold plate cover 230. The cold plate base 260 can also include a fluid outtake region 263 adjacent to the fluid outtake aperture of the cold plate cover 230. The cold plate base 260 also includes a fin region 290 between the fluid intake region 261 and the fluid outtake region 263. The cold plate base 260 can include a fluid distribution mechanism 265 adjacent to the fluid intake region 261. It should be understood that the fluid distribution mechanism 265 is instrumental in preventing the reverse flow discussed with respect to FIG. 1. However, the fin region 90 can provide a similar functionality with a similar configuration. For example, the fluid distribution mechanism 265 and the fin region 290 can be a uniform structure. Alternatively, the fin region 290 can be configured with a shape resembling the fluid distribution mechanism 265. In that way, the fin region 90 can be configured with elongated walls in the place of the matrix arrangement of rectangular and cylindrical shape fins.

Figure 3:
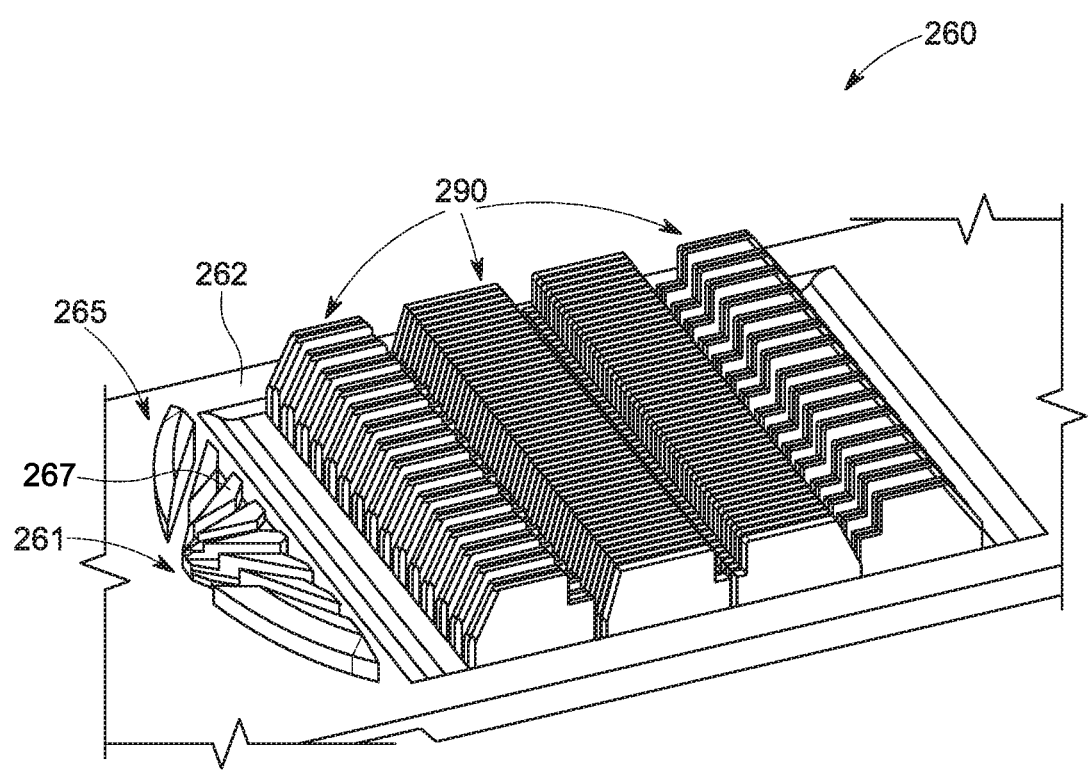
FIG. 3 illustrates the exemplary cooling plate base, in accordance with an implementation of the disclosure.

FIG. 3 illustrates the exemplary cold plate base 260, in accordance with an implementation of the disclosure fluid outtake region. As indicated above, the cold plate base 260 can include a fluid distribution mechanism 265 adjacent to the fluid intake region 261. The cold plate base 260 can include a base surface 262. The fluid distribution mechanism 265 can include protrusions 267 extending from the base surface 262 to create flow paths. In some embodiments, the protrusions 267 can create five or more flow paths. Each of the protrusions 267 can be positioned to radiate outward from the fluid intake region 261 and create flow paths across the fin region 290.

Figure 5:
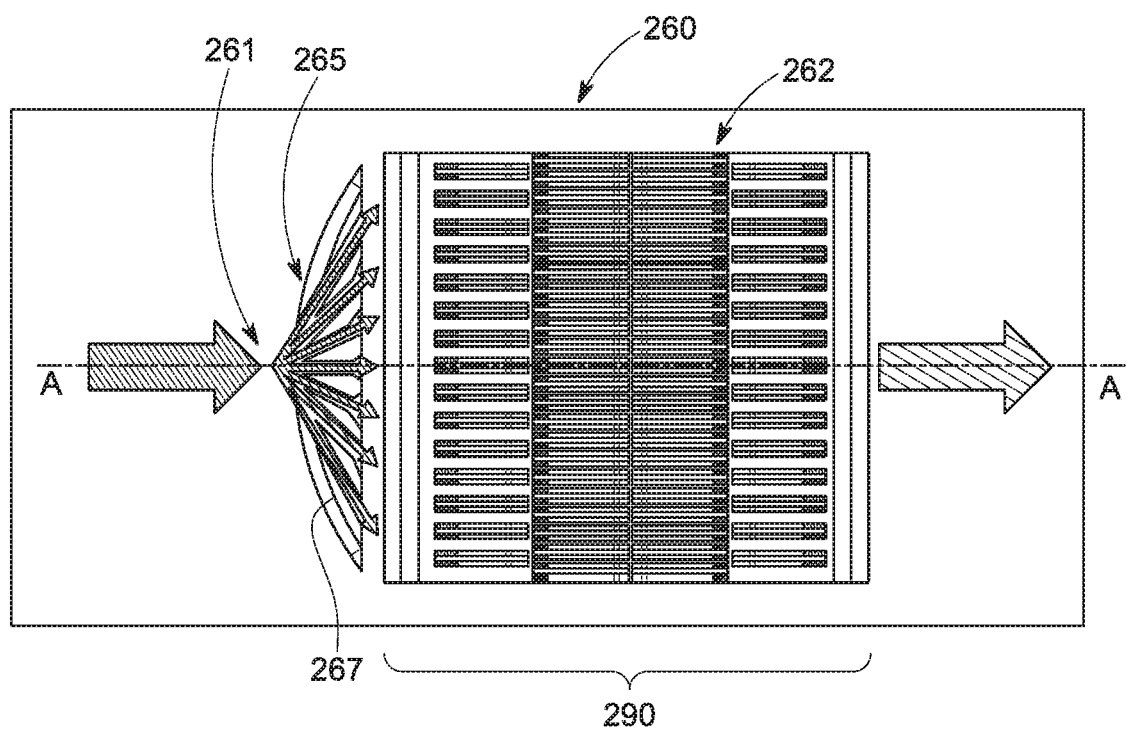
FIG. 5 illustrates a top view of the exemplary cooling plate base, in accordance with an implementation of the disclosure.

Referring momentarily to the top view of cold plate base 260, as shown in FIG. 5, the protrusions 267 extending from the base surface can have a central axis A-A. Each of the protrusions 267 can be symmetrical about the central axis A-A to create flow paths. The flow paths can be evenly spaced about the fin region 290. Other orientations of the multiple protrusions 267 can be considered and incorporated herein. For example, in some embodiments the protrusions 267 can be oriented based on common shape profiles of the heat generating component 60. In this embodiment, the flow paths can be spaced to direct more fluid flow towards the outer areas of the fin region 290.

Figure 4A:
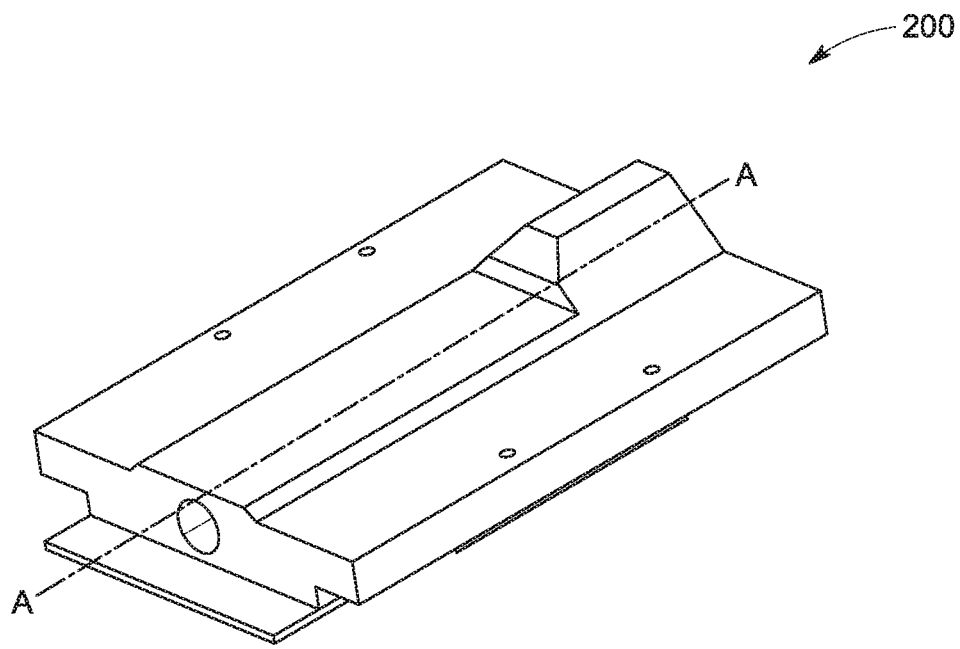
FIG. 4A illustrates an assembled view of the cooling plate of FIG. 2 with cross-section A-A, in accordance with an implementation of the disclosure.
Figure 4B:
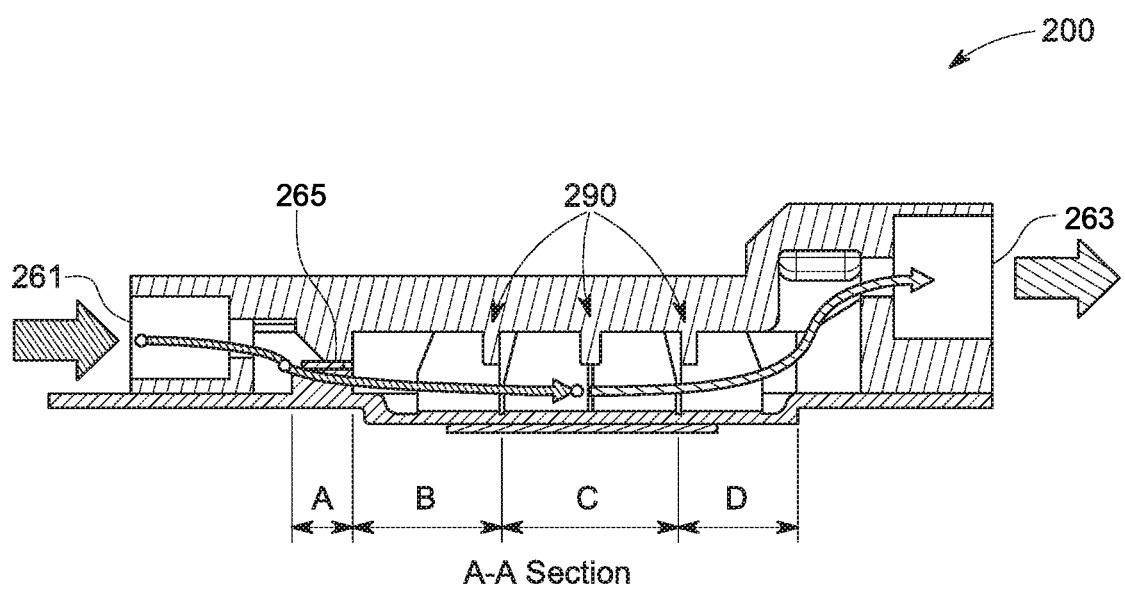
FIG. 4B illustrates the cooling plate of FIG. 4A at cross-section A-A, in accordance with an implementation of the disclosure.

FIG. 4A illustrates an assembled view of the cooling plate 200 at cross-section A-A, in accordance with an implementation of the disclosure. FIG. 4B illustrates fluid flow within the cooling plate 200, as seen at cross-section A-A. The fin region 290 can include multiple rows of fins. For the purpose of this example, the fin region 290 can include four rows of fins. The fin region 290 can include three regions: B, C, and D. Region B includes a first row of fins closest to the fluid intake region 261. Region D includes a second row of fins closest to the fluid outtake region 263. Region C includes a row, or multiple rows, of fins located between regions B and D. The fins located in regions B and D can have a different configuration from the fins on the inner rows in Region C. Regions B, C, and D include different fin pitches to optimize the cold plate performance. Region A of FIG. 4B corresponds to the fluid distribution mechanism 265 of FIG. 3.

Figure 6:
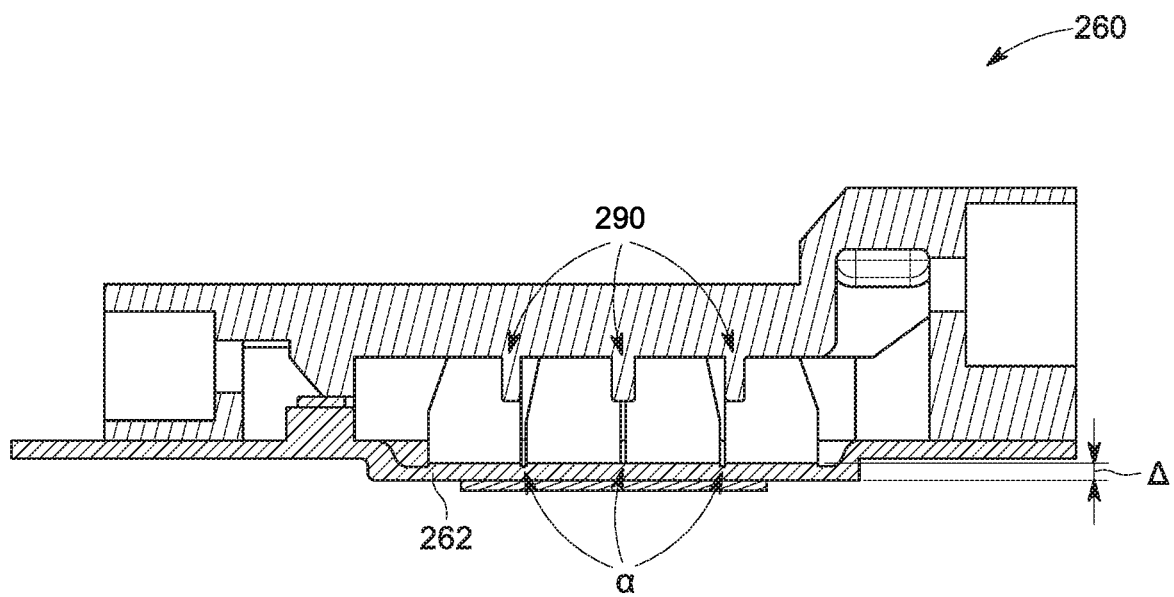
FIG. 6 illustrates the cooling plate at cross-section A-A, in accordance with an implementation of the disclosure.

FIG. 6 illustrates the cold plate base 260 at the cross-section A-A, in accordance with an implementation of the disclosure. In some embodiments, the row of fins can be spaced apart by gap α to encourage enhanced flexibility of the cold plate base 260. In some embodiments, the gap α can be between 1-2 mm to optimize cooling performance. Furthermore, the base surface 262 of the cold plate base 260 beneath the fin region 290 can include a thickness Δ of up to 2 millimeters. This thickness Δ of the base surface 262 encourages flexibility of the cold plate base 260. In alternative embodiments, the base surface 262 of the cold plate base 260 beneath the fin region 290 can include thermal conductive flexible material. In some embodiments, the base surface 262 can be made from aluminum or copper. It should be understood, that the ideal thermal conductive flexible material has superior thermal at an efficient cost.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cold plate base comprising:
   a fluid intake region located at a distal end of the cold plate, and a fluid outtake region located at a proximal end of the cold plate that is opposite the distal end;
   a fin region positioned between the fluid intake region and the fluid outtake region, wherein the fin region extends from a base surface of the cold plate base, the fin region comprising at least one wall region, the at least one wall region comprising a plurality of elongated walls configured in a non-matrix arrangement; and
   a plurality of protrusions at the fluid intake region, wherein each of the plurality of protrusions radiates from the fluid intake region to create flow paths across the fin region.

2. The cold plate base of claim 1, wherein the plurality of protrusions has a central axis, and each of the plurality of protrusions is symmetrical about the central axis.

3. The cold plate base of claim 1, wherein the fin region comprises at least one region comprising multiple rows of fins in addition to the at least one wall region, each wall region separated from an adjacent region comprising the multiple rows of fins by a fin region gap.

4. The cold plate of claim 3, wherein the flow paths are evenly spaced about the plurality of wall regions.

5. The cold plate base of claim 1, wherein the base surface of the cold plate base beneath the fin region has a thickness of up to 2 millimeters.

6. The cold plate base of claim 1, wherein the base surface of the cold plate base beneath the fin region comprises a conductive flexible material.

7. A cooling apparatus comprising:
   a radiator; and
   a cold plate connected to the radiator by at least two fluid tubes, the cold plate comprising a cold plate base comprising:
   a fluid intake region located at a distal end of the cold plate, and a fluid outtake region located at a proximal end of the cold plate that is opposite the distal end;
   a fin region positioned between the fluid intake region and the fluid outtake region, wherein the fin region extends from a base surface of the cold plate base, the fin region comprising at least one wall region, the at least one wall region comprising a plurality of elongated walls configured in a non-matrix arrangement; and
a plurality of protrusions at the fluid intake region, wherein each of the plurality of protrusions radiates from the fluid intake region to create flow paths across the fin region.

8. The cooling apparatus of claim 7,
wherein the plurality of protrusions has a central axis, and each of the plurality of protrusions is symmetrical about the central axis.

9. The cooling apparatus of claim 7, wherein the fin region comprises at least one region comprising multiple rows of fins in addition to the at least one wall region, each wall region separated from an adjacent region comprising the multiple rows of fins by a fin region gap.

10. The cooling apparatus of claim 9, wherein the flow paths are evenly spaced about the plurality of wall regions.

11. The cooling apparatus of claim 7, wherein the base surface of the cold plate base beneath the fin region has a thickness of up to 2 millimeters.

12. The cooling apparatus of claim 7, wherein the base surface of the cold plate base beneath the fin region comprises a conductive flexible material.

13. The cooling apparatus of claim 7,
wherein the cold plate further comprises a cold plate cover configured to cover the cold plate base, the cold plate cover comprises a fluid intake aperture aligned with the fluid intake region and a fluid outtake aperture aligned with the fluid outtake region.

14. The cooling apparatus of claim 7,
wherein the cold plate is configured to be coupled with an electrical component.

15. A server device comprising:
at least one electronic component; and
a cooling apparatus configured to couple with the at least one electronic component, the cooling apparatus comprising:
a radiator; and
a cold plate connected to the radiator by at least two fluid tubes, the cold plate comprising a cold plate base comprising:
a fluid intake region located at a distal end of the cold plate, and a fluid outtake region located at a proximal end of the cold plate that is opposite the distal end;
a fin region positioned between the fluid intake region and the fluid outtake region, wherein the fin region extends from a base surface of the cold plate base, the fin region comprising at least one wall region, the at least one wall region comprising a plurality of elongated walls configured in a non-matrix arrangement; and
a plurality of protrusions at the fluid intake region, wherein each of the plurality of protrusions radiates from the fluid intake region to create flow paths across the fin region.

16. The server device of claim 15,
wherein the plurality of protrusions has a central axis, and each of the plurality of protrusions is symmetrical about the central axis.

17. The server device of claim 16, wherein the fin region comprises at least one region comprising multiple rows of fins in addition to the at least one wall region, each wall region separated from an adjacent region comprising the multiple rows of fins by a fin region gap.

18. The server device of claim 17, wherein the flow paths are evenly spaced about the plurality of wall regions.

19. The server device of claim 15, wherein the base surface of the cold plate base beneath the fin region has a thickness of up to 2 millimeters.

20. The server device of claim 15, wherein the base surface of the cold plate base beneath the fin region comprises a conductive flexible material.

* * * * *